(12) United States Patent
Christophersen et al.

(10) Patent No.: US 7,968,959 B2
(45) Date of Patent: Jun. 28, 2011

(54) METHODS AND SYSTEMS OF THICK SEMICONDUCTOR DRIFT DETECTOR FABRICATION

(75) Inventors: Marc Christophersen, Alexandria, VA (US); Bernard F. Phlips, Great Falls, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 100 days.

(21) Appl. No.: 12/581,710

(22) Filed: Oct. 19, 2009

(65) Prior Publication Data

US 2010/0096674 A1    Apr. 22, 2010

Related U.S. Application Data

(60) Provisional application No. 61/106,460, filed on Oct. 17, 2008, provisional application No. 61/106,417, filed on Oct. 17, 2008.

(51) Int. Cl.
*H01L 31/115* (2006.01)
*H01L 21/00* (2006.01)

(52) U.S. Cl. ............ 257/429; 257/622; 257/E21.218; 257/E31.092; 250/370.01; 438/56

(58) Field of Classification Search .............. 257/290, 257/428, 429, 622, E21.218, E31.092; 438/56, 438/57, 88, 712; 250/370.01
See application file for complete search history.

(56) References Cited

U.S. PATENT DOCUMENTS

| 5,310,623 | A | 5/1994 | Gal |
| 6,204,087 | B1 * | 3/2001 | Parker et al. .................. 438/56 |
| 6,259,085 | B1 | 7/2001 | Holland |
| 6,421,414 | B1 * | 7/2002 | Huber ............................ 378/45 |
| 6,849,843 | B2 | 2/2005 | Ansorge et al. |
| 6,884,551 | B2 * | 4/2005 | Fritze et al. ....................... 430/5 |
| 6,985,184 | B2 | 1/2006 | Sato |
| 7,238,949 | B2 * | 7/2007 | Struder et al. ............ 250/370.1 |
| 7,518,203 | B2 * | 4/2009 | Lutz et al. ..................... 257/429 |
| 2001/0020671 | A1 | 9/2001 | Ansorge et al. |

(Continued)

FOREIGN PATENT DOCUMENTS

DE    10004891 A1    8/2001

OTHER PUBLICATIONS

Emilio Gatti and Pavel Rehak; An Application of a Novel Charge Transport Scheme; Nuclear Instruments and Methods in Physics Research; 1984; pp. 608-614; vol. 225; North-Holland Physics Publishing Division; Upton, New York, USA.

(Continued)

*Primary Examiner* — Tuan N. Quach
(74) *Attorney, Agent, or Firm* — Amy L. Ressing; John Leonard Young

(57) ABSTRACT

Gray-tone lithography technology is used in combination with a reactive plasma etching operation in the fabrication method and system of a thick semiconductor drift detector. The thick semiconductor drift detector is based on a trench array, where the trenches in the trench array penetrate the bulk with different depths. These trenches form an electrode. By applying different electric potentials to the trenches in the trench array, the silicon between neighboring trenches fully depletes. Furthermore, the applied potentials cause a drifting field for generated charge carriers, which are directed towards a collecting electrode.

20 Claims, 19 Drawing Sheets

U.S. PATENT DOCUMENTS

| | | | |
|---|---|---|---|
| 2005/0109918 A1 | 5/2005 | Nikzad et al. | |
| 2006/0180834 A1 | 8/2006 | Holland | |
| 2009/0092934 A1 | 4/2009 | Christophersen et al. | |
| 2011/0012216 A1* | 1/2011 | Morichi et al. | 257/429 |

OTHER PUBLICATIONS

Rehak, Walton, Gatti, Kemmer, Dietl, Klanner, Lutz, Wylie, and Becker; Progress in Semiconductor Drift Detectors; Nuclear Instruments and Methods in Physics Research; 1986; pp. 367-378; vol. A248; Elsevier Science Publishers B.V. North-Holland Physics Publishing Division; Amsterdam.

Henke, Hoppe, Quenzer, Staudt-Fischback, and Wagner; Simulation assisted design of processes for gray-tone lithography; Microelectronic Engineering; 1995 pp. 267-270; vol. 27 Elsevier Science Publishers B.V.

Lechner, Eckbauer, Hartmann, Krishch, Hauff, Richter, Soltau, Struder, Fiorini, Gatti, Longoni, and Sampietro; Silicon drift detectors for high resolution room temperature X-ray spectroscopy; Nuclear Instruments and Methods in Physics Research; 1996; pp. 346-351; vol. A377, Elsevier Science B.V.

Castoldi, Guazzoni, Longoni, Gatti, Rehak, and Struder; Conception and Design Criteria of a Novel Silicon Device for the Measurement of Position and Energy of X Rays; IEEE Transactions on Nuclear Science; (Oct. 1997); pp. 1724-1732; vol. 44; No. 5; IEEE; USA.

Don Groom; Lateral diffusion in a partially depleted thick CCD; HiRho CCD Internal Note; Ernest Orlando Lawrence Berkeley National Laboratory; 1997; Berkeley, CA, USA.

Parker, Kenney, and Segal; 3D—A proposed new architecture for solid-state radiation detectors; Nuclear Instruments and Methods in Physics Research; 1997; pp. 328-343; vol. A395; Elsevier Science B.V.

Atlas User's Manual: Device Simulation Software; (Nov. 1998); pp. 1-294; vol. II; SILVACO Int'l; Santa Clara, CA, USA.

Tull, Iwanczyk, Patt, and Barkan; High Efficiency Silicon X-Ray Detectors; IEEE Transactions on Nuclear Science; (Aug. 2004); pp. 1803-1807; vol. 51; No. 4; IEEE; USA.

Piemonte, Rashevsky, and Vacchi; Device simulation of the ALICE silicon drift detector; Microelectronics Journal; 2006; pp. 1629-1638; vol. 37 Elsevier.

Ackermann, McGraw, and Zimmer; Are curved focal planes necessary for wide-field survey telescopes?; Ground-based and Airborne Telescopes; Proceedings of SPIE; 2006; pp. 626740-1 through 626740-10; vol. 6267; SPIE.

Daniela Radtke, and Uwe D. Zeitner; Laser-lithography on non-planar surfaces; Optics Express; (Feb. 5, 2007); pp. 11671174; vol. 15; No. 3; Optical Society of America.

Li, Chen, Guo, Lissauer, Lynn, Radeka, and Pellegrini; Development, simulation and processing of new 3D Si detectors; Nuclear Instruments and Methods in Physics Research; 2007; pp. 139-148; vol. A583; Elsevier B.V.

Lothor Struder; Home made imaging X-ray detectors—high speed, low noise, low power, radiation hard, high Q. E.; (Feb. 7, 2007); pp. 1-36 and cover sheet; University of Siegen, Munich.

Bernard F. Phlips and Marc Christophersen; Curved Radiation Detector; IEE Nuclear Science Symposium Conference Record; 2008; pp. 2200-2205; IEEE; USA.

Marc Christophersen and Bernard Phlips; Gray-tone lithography using an optical diffuser and a contact aligner; Applied Physics Letters; 2008; pp. 194102-1 through 194102-3; vol. 92; American Institute of Physics.

Ko, Stoykovich, Song, Malyarchuk, Choi, Yu, Geddes III, Ziao, Wang, Huang, and Rogers; a hemispherical electronic eye camera based on compressible silicon optoelectronics; Nature Letters; (& Aug. 2008); pp. 748-753; vol. 454; Macmillan Publishers Ltd.

Rim Catrysse, Dinyari, Huang, and Peumans; The optical advantages of curved focal plane arrays; Optical Express: (Mar. 31, 2008); pp. 4965-4971; vol. 16; No. 7.

PNSensor: Research and Development; (accessed on the Internet, (Oct. 31, 2009)); pp. 1-34; [http://www.pnsensor.de/index.html].

Marc Christophersen and Bernard Phlips; Thick Silicon Drift Detectors; [presentation] Nuclear Science Symposium; (Oct. 19-25, 2008); pp. 1-23; US Naval Research Laboratory; USA.

Advanced Imaging Technology: Application-Specific Design Elements; MIT Lincoln Laboratory-Massachusetts Institute of Technology; (accessed on the Internet (Oct. 22, 2009)); [http://www.II.mit.edu/mission/electronics/AIT/Appspecific.html]; pp. 1-5; MIT.

* cited by examiner

VIEWS OF A 3D SILICON DRIFT DETECTOR
600

VIEWS OF A 3D SILICON DRIFT DETECTOR
600

SEM MICROGRAPH CROSS-SECTION VIEW OF DIFFERENT DEPTH TRENCHES
ON FRONT AND BACK OF A 1 MILIMETER THICK SILICON WAFER
(FRONT AND BACK)
900

METHODS AND SYSTEMS OF THICK SEMICONDUCTOR DRIFT DETECTOR FABRICATION

RELATED APPLICATIONS

This U.S. patent application is related to U.S. provisional patent application No. 61/106,460 Methods and Systems of Thick Silicon Drift Detector Fabrication and to U.S. provisional patent application No. 61/106,417 Methods and Systems of Curved Radiation Detector Fabrication and, each provisional application having the same joint inventors and each provisional application filed on the same day (Oct. 17, 2008) are incorporated by reference herein in their entirety. Additionally, this U.S. patent application is related to U.S. patent application Ser. No. 12/581,469, for Methods and Systems of Curved Radiation Detector Fabrication, filed on Oct. 19, 2009 and incorporated by reference herein in its entirety. Further, this U.S. patent application is related to Patent Cooperation Treaty application PCT/US2009/061200, for Thick Silicon Drift Detector Fabrication and Patent Cooperation Treaty application PCT/US2009/061198, for Curved Radiation Detector Fabrication, both designating the United States as the International Searching Authority and incorporated by reference herein in their entirety.

FIELD OF THE INVENTION

The present invention relates to the fabrication of solid state components, such as silicon drift detectors used for spectroscopic measurements. Most modern electron microscopes use thin silicon drift detectors for X-ray spectroscopy. The thickness of standard thin silicon drift detectors is a limiting factor for the detection efficiency.

BACKGROUND OF THE INVENTION

Generally, X-ray detectors are basically pin (p (p type doping), i (intrinsic), and n (n type doping)) structures in a semiconductor. The n 102 and p 106 type electrodes are large in area having homogeneous contacts on the front and back 310 sides. See FIG. 1 (standard planar detector 100) and FIG. 3 (Second generation silicon drift detector (with integrated FET 300)). Detectors that operate in room temperature environments have resolutions normally limited by two factors (1) impurity concentration and (2) device capacitance. The impurity concentration is determined by the quality of the starting material and the cleanliness of the semiconductor processing. The capacitance is determined by the electrode design. In the case of large homogenous contacts, such as N+ ohmic bulk contact (OV) 102, the capacitance is inherently large.

Thick silicon drift detectors (SDDs) have better "X-ray stopping power" due to the increased silicon mass. Denser semiconductor materials such as Cadmium telluride (CdTe) and Cadmium zinc telluride (CdZnTe) have also increased X-ray stopping power in comparison to standard (thin) silicon SDDs. The advantage of the present invention over CdTe or CdZnTe based detectors is the result of a much lower noise level due to very low capacitances.

"Silicon drift detectors" have set new records as room-temperature semiconductor detectors for X- and gamma-ray spectroscopy. When compared with classical photomultiplier tubes (PMTs), SDDs offer the typical advantages of a silicon photo-detector, i.e., a higher quantum efficiency for scintillation light, the possibility of a monolithic integration of arrays of photo-detectors of almost any area and shape, and the immunity to magnetic fields. Moreover, if compared with conventional silicon pn-photo-detectors of the same active area and thickness, SDDs allow for better energy resolutions and lower detection thresholds due to the lower level of electronics noise arising from the smaller value of output capacitance.

Most SDDs have device thicknesses around 300 µm and applied voltages at the drifting cathodes 1302 range from −200 to −30 V (see FIG. 13A and 13B). A 300 µm device-thickness limits the practical x-ray detection efficiency to about 20 keV. The x-ray efficiency for 300 µm thick Si falls off rapidly above 10 keV, with 50% efficiency at 15 keV and only 9% at 30 keV. Currently, there are a large number of XRF (X-ray fluorescence) measurements that can benefit from the increase in efficiency at higher energies afforded by these new thick devices, including DoD, DoE, medical, space, and Homeland Security applications.

The general concept of a silicon drift detector (SDD) was first proposed by E. Gatti, P. F. Rehak, Nucl. Jnstrum. Methods 225, 608 (1984) and later realized by P. Rehak, J. Walton, E. Gatti, A. Longoni, M. Sampietro, J. Kemmer, H. Dietl, P. Holl, R. Klanner, G. Lutz, A. Wylie and H. Becker, Nucl. Instrum. Methods A 248, 367 (1986). In an SDD (referring to FIG. 2) two superimposed fields from the device front- and back-side direct generated electric carriers electrons 108 to a small collecting anode 206. The general electronic noise performance is improved in comparison to standard x-ray detectors because of the small size of the collecting anode 206 (low capacitance). FIG. 2 shows a first generation SDD, where drift strips 202 on the back (see back plate 210)- and front-side generate a lateral "drift-field" (see path 208) for the carrier.

Detectors with high-aspect ratio holes (or trenches) were first introduced by S. Parker, C. Kenney and J. Segal, Nucl Inst. Meths. A 395, 328 (1997) as radiation hard detectors, having vertical electrodes to deplete laterally the detector matrix—see FIG. 6A and FIG. 6B; these holes (see hole array 602) were fabricated by micro-machining techniques.

Several improvements to the SDD have been published, see e.g. L. Strüder, presentation at Advanced Instrumentation Seminars, SLAC, Stanford, [Presentation conducted Feb. 7, 2007, accessed on the Internet on Sep. 24, 2009 at: [http://www-group.slac.stanford.edu/ais/past SeminarDetails.asp?seminarID=60]. FIG. 3 shows a second generation silicon drift detector with an integrated Field Effect Transistor (FET) 300. The FET 300, having a source 302, gate 304 and drain 306, acts as an amplifier and yields to higher resolution. FIG. 4 shows an SDD in a "bulls-eye" shape with an integrated FET 400.

Contemporary SDDs incorporate planar geometry. The different generations of SDDs vary as to how the drift electrodes are arranged on the front- and back 310-surface. Most SDDs have device thicknesses around 300 µm and applied voltages at the drifting cathodes 1302 range from −200 to −30 V (see FIG. 13A and 13B); see for example: P. Lechner, S. Eckbauer, R. Hartmann, S. Krisch, D. Hauff, R. Richter, H. Soltau, L. Strueder, C. Fiorini, E. Gatti, A. Longoni and M. Sampietro, Nucl. Instrum. Methods A 377, 346 (1996); and A. Castoldi, C. Guazzoni, E. Gatti, A. Longoni, P. Rehak, L. Strueder, "IEEE Trans. Nucl. Sci. NS 44, 1724 (1997); and C. Piemonte, A. Rashevsky, A. Vacchi, Microelectronic J, 37, 1629 (2006).

A 300 µm device-thickness limits the practical X-ray detection efficiency to about 20 keV, see FIG. 5. The x-ray efficiency for 300 µm thick Si falls off rapidly above 15 keV, with 50% efficiency at 15 keV and only 9% at 30 keV. Currently, there are a large number of XRF (X-ray fluorescence)

experiments that could benefit from the increase in efficiency at higher energies afforded by thicker devices.

So far, only C. R. Tull et al. presented up to 1.5 mm thick SDD detectors, see C. R. Tull, J. S. Iwanczyk, B. E. Patt, S. Barkan, L. Feng, IEEE Trans. Nucl. Sci. NS 51, 1803 (2004). Very high resistivity float zone (FZ) material (26,000 Ωcm resistivity) was used as a substrate in order to minimize the required operating voltages. The guard ring structure was designed to hold up 1,000 V bias. The device size varied from 10 to 20 mm$^2$.

Therefore, the need exists for a fabrication method to produce thicker silicon drift detectors with improved hard x ray spectroscopy performance over current room temperature semiconductor detectors.

SUMMARY OF THE INVENTION

A method and system for a process and a product are implemented in the fabrication of a curved detector by shaping silicon. The method and system for the process and the product are implemented in the fabrication of a thick silicon drift detector (TSDD). A gray tone lithography operation is used in combination with a plasma etching operation to etch a silicon substrate to a desired shape (i.e., physical configuration). Gray tone lithography is a way of photo sculpting resist films to create three dimensional (3D) profiles in photo resist via a low cost, short cycle time, single exposure process. Gray tone lithography in combination with reactive ion etching (REI) and deep reactive ion etching (DRIE) allow the resist profiles to be transformed into 3D silicon structures, including silicon drift detectors. The combination of gray tone lithography and a dry reactive ion etch process is called gray tone technology.

After transferring the resist profile into silicon a single sided strip detector is fabricated by ion implantation. The gray tone lithography operation is performed with a spray on resist.

DETAILED DESCRIPTION OF THE INVENTION

Figure 1:
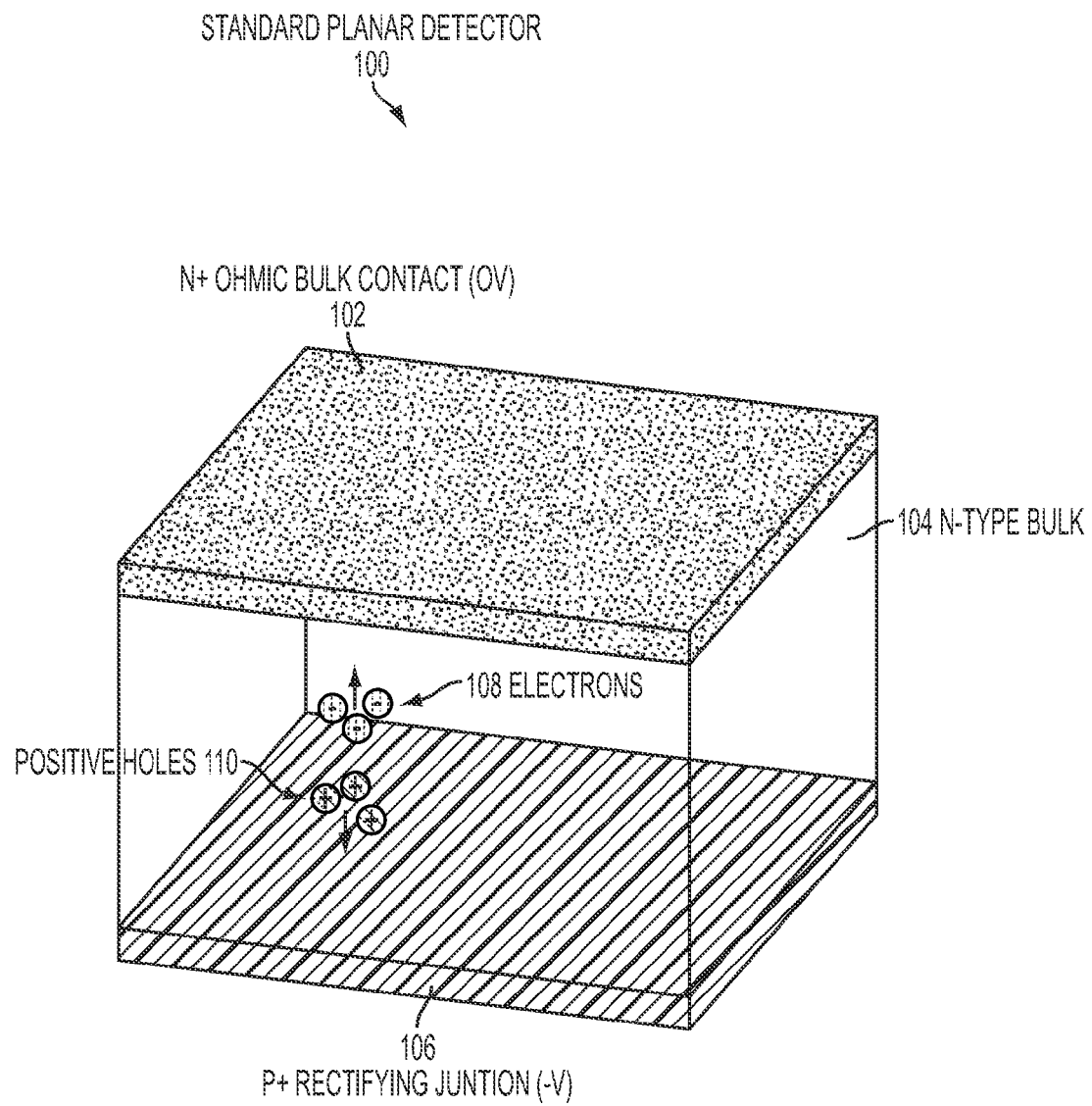
FIG. 1 illustrates a standard planar detector.
Figure 2:
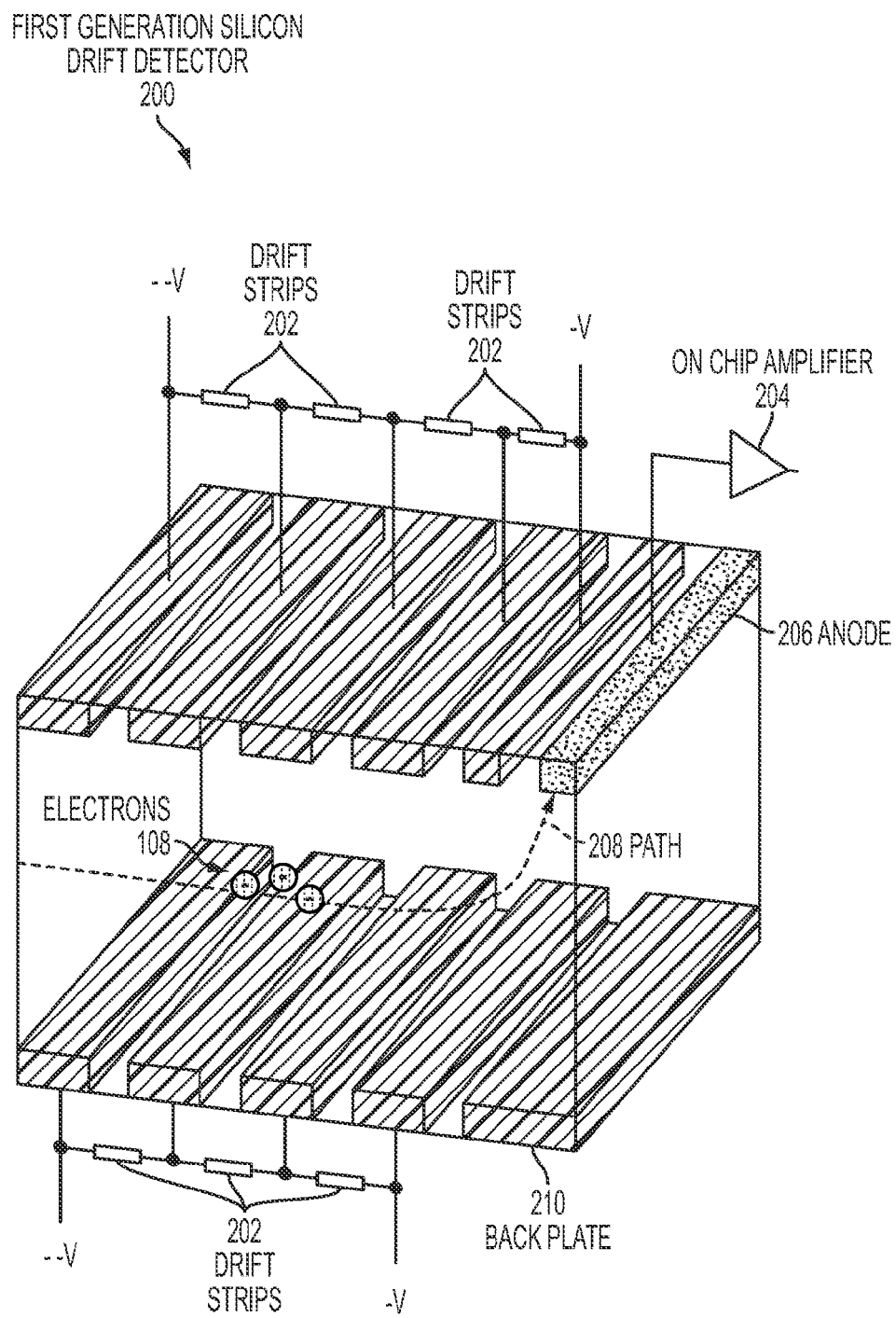
FIG. 2 illustrates a first generation SDD.

Preferred exemplary embodiments of the present invention are now described with reference to the figures, in which like reference numerals are generally used to indicate identical or functionally similar elements. While specific details of the preferred exemplary embodiments are discussed, it should be understood that this is done for illustrative purposes only. A person skilled in the relevant art will recognize that other configurations and arrangements can be used without departing from the spirit and scope of the preferred exemplary embodiments. It will also be apparent to a person skilled in the relevant art that this invention can also be employed in other applications. Further, the terms "a", "an", "first", "second" and "third" etc. used herein do not denote limitations of quantity, but rather denote the presence of one or more of the referenced items(s).

In accordance with exemplary embodiments, a method and system for a process and a product are implemented in the fabrication of thick "silicon drift detectors" (SDDs) having significantly improved hard X-ray spectroscopy performance over current room-temperature semiconductor detectors; and the SDD fabrication described herein includes a fabrication method and a fabrication system which circumvent increasing voltage with the thickness of the SDD device. The fabrication method relies on gray tone lithography operations, which can be used in forming curved detectors by shaping silicon. A gray tone lithography operation is used in combination with a plasma etching operation to etch the silicon to a desired shape (i.e., physical configuration).

According to exemplary embodiments, the SDD fabrication described herein is a fabrication method that circumvents increasing voltage with the thickness. There is a practical limitation for the thickness of a planar SDD: As the detector thickness increases, the depletion voltage increases with the square of the thickness, which can quickly bring the operating voltage into the range where catastrophic breakdown of the device can occur. This is true for any detector, pin diode or SDD. In the case of an SDD, the applied drift-voltages need to be fully depleted from the bulk substrate in order to direct the electronic carriers. For SDDs, a reduction in voltage is critical for easier operation in the field. The applied voltage also depends on the doping level from the starting material. Thus, exemplary embodiments allow the use of cheaper substrate materials for SDDs.

Thick "silicon drift detectors" (SDDs) have significantly improved hard X-ray spectroscopy performance over current room-temperature semiconductor detectors. A plurality of trenches (or holes) with different depths are etched into a semiconductor bulk material. These trenches allow for a lateral depletion, charge carrier collection, and "guide" the electrical carrier current to a small collecting electrode.

Figure 7:
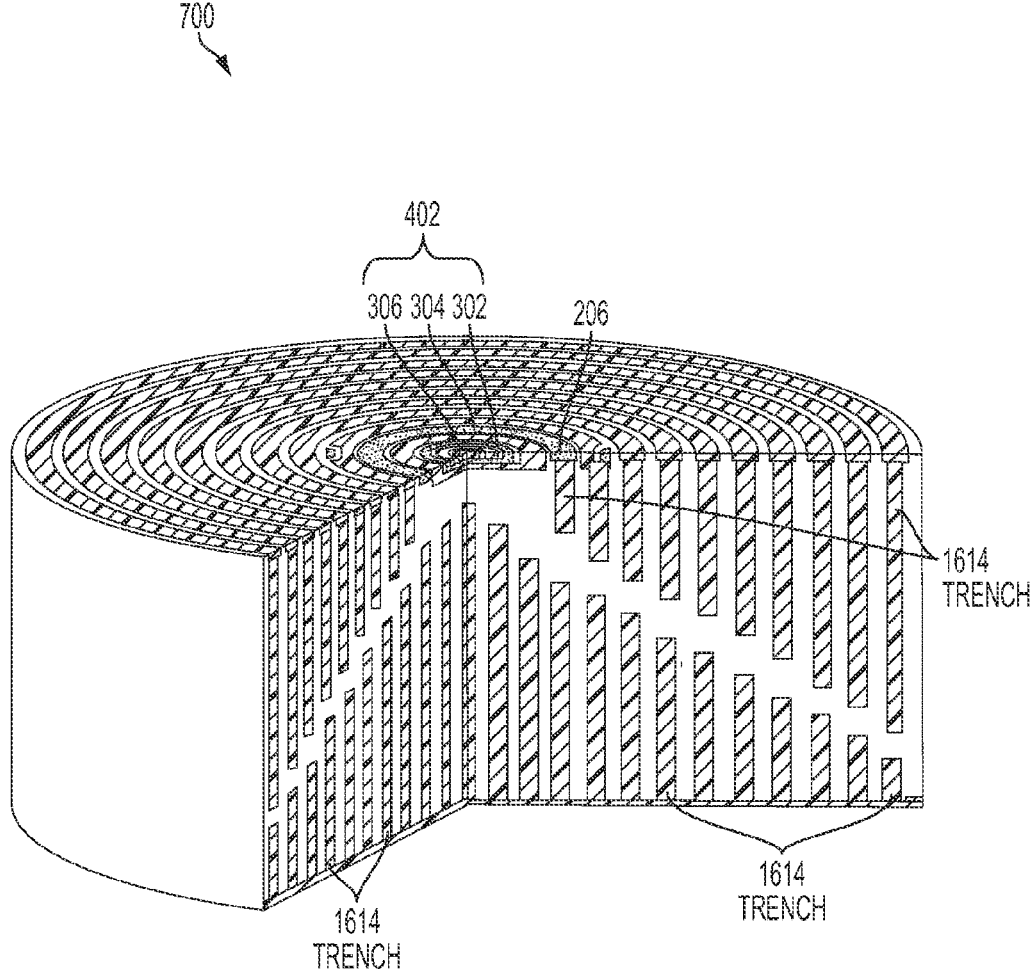
FIG. 7 illustrates a schematic of inventive trenching.

The basic geometry is based on different depth holes or trenches. (Geometries with non-penetrating trenches are sometimes called "semi 3D detectors, as described in Z. Li, W. Chen, Y. H. Guo, D. Lissauer, D. Lynn, V. Radeka, G. Pellegrini Nucl Inst. Meths. A 583, 139 (2007)). A schematic is shown in FIG. 7 of a bulls-eye shaped silicon drift detector. These detectors are known as "3D SDDs" because their design is a combination of an SDD and a semi 3D detector with modulated hole/trench depths 700.

In contrast to standard lithography, which leads to "black and white pattern", gray tone lithography is used to structure a plurality of resist thicknesses.

Figure 16:
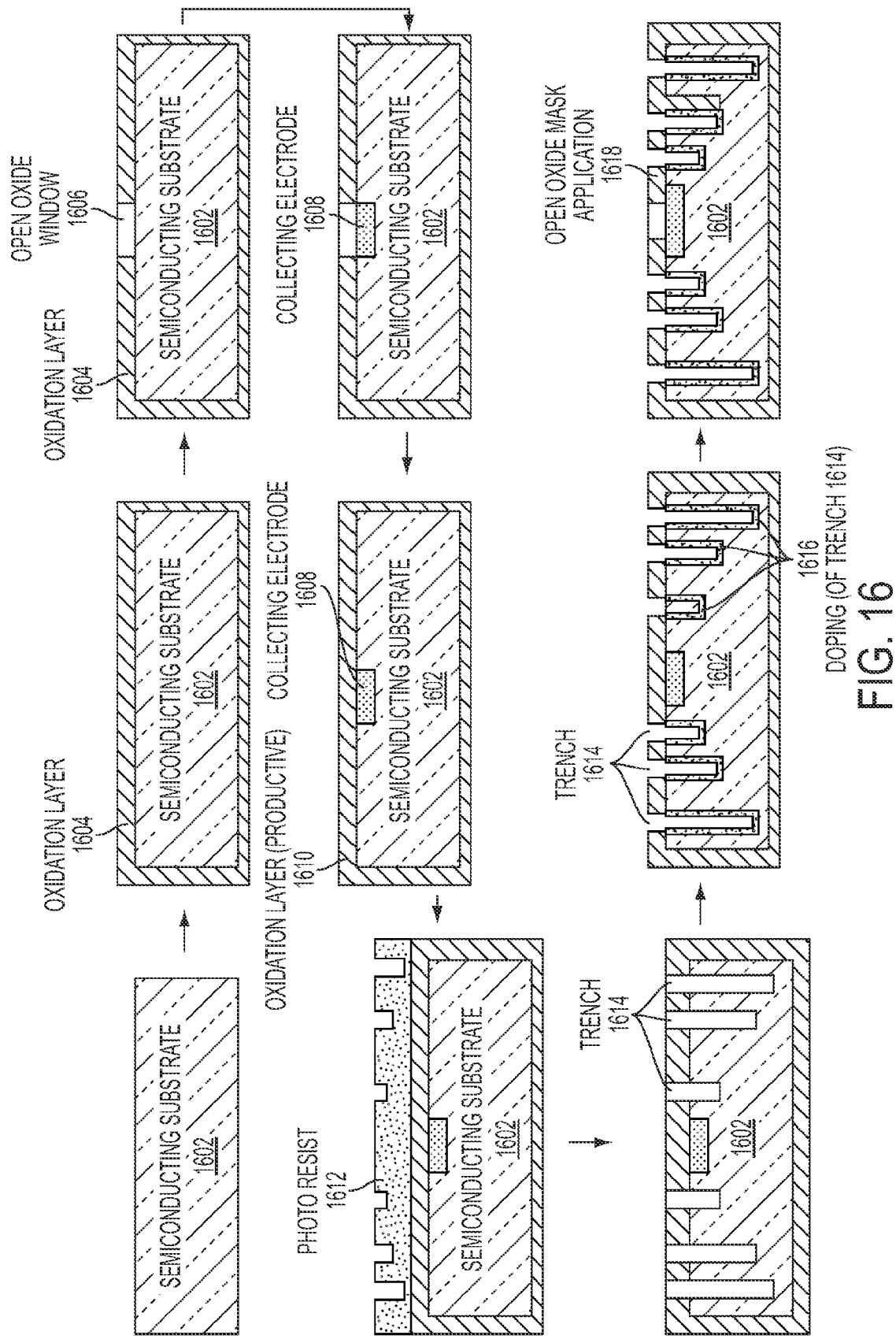
FIG. 16 illustrates a resulting thick silicon drift detector device and the stages of fabricating the device.

In exemplary embodiments, referring to FIG. 16, gray tone lithography is a way of photo sculpting resist films to create three dimensional (3D) profiles in photo resist 1612 via a low cost, short cycle time, single exposure process. Gray tone lithography in combination with reactive ion etching (REI) and deep reactive ion etching (DRIE) allows the resist profiles to be transformed into 3D silicon structures and/or topographies. The combination of gray tone lithography and a dry reactive ion etch process is called gray tone technology. The combination of gray-tone lithography and dry etching can be applied to any semiconducting material, silicon being the most prominent example; thus, facilitating the creation of 3D structures in silicon or any other semiconductor material by way of a low cost, short cycle time, single exposure process.

According to exemplary embodiments, the key to the realization of 3D SDDs is the micro-fabrication of the plurality of trenches 1614 having a plurality of different depth structures with well-defined curved surface contours. In exemplary embodiments, gray-tone lithography is used for the trench 1614 formation.

Exemplary embodiments of "3D SDD" fabrication effectively de-couple device thickness from device voltage requirements. The depletion voltage between the trenches, such as trench 1614, is determined by the trench 1614 distance (and substrate resistivity), not device thickness. However, achievable trench 1614 fabrication limits the overall device thickness. FEM (finite element) simulations have been performed to optimize the 3D SDD structure using an "ATLAS DEVICE SIMULATOR", produced by SILVACO INTERNATIONAL. All of such simulations were performed solving both Poisson's equation and carrier continuity equations. Based on these simulations, it was possible to have a complete description of the system in terms of electrical quantities (potential and electric field distributions, carrier distributions and current densities).

Figure 3:
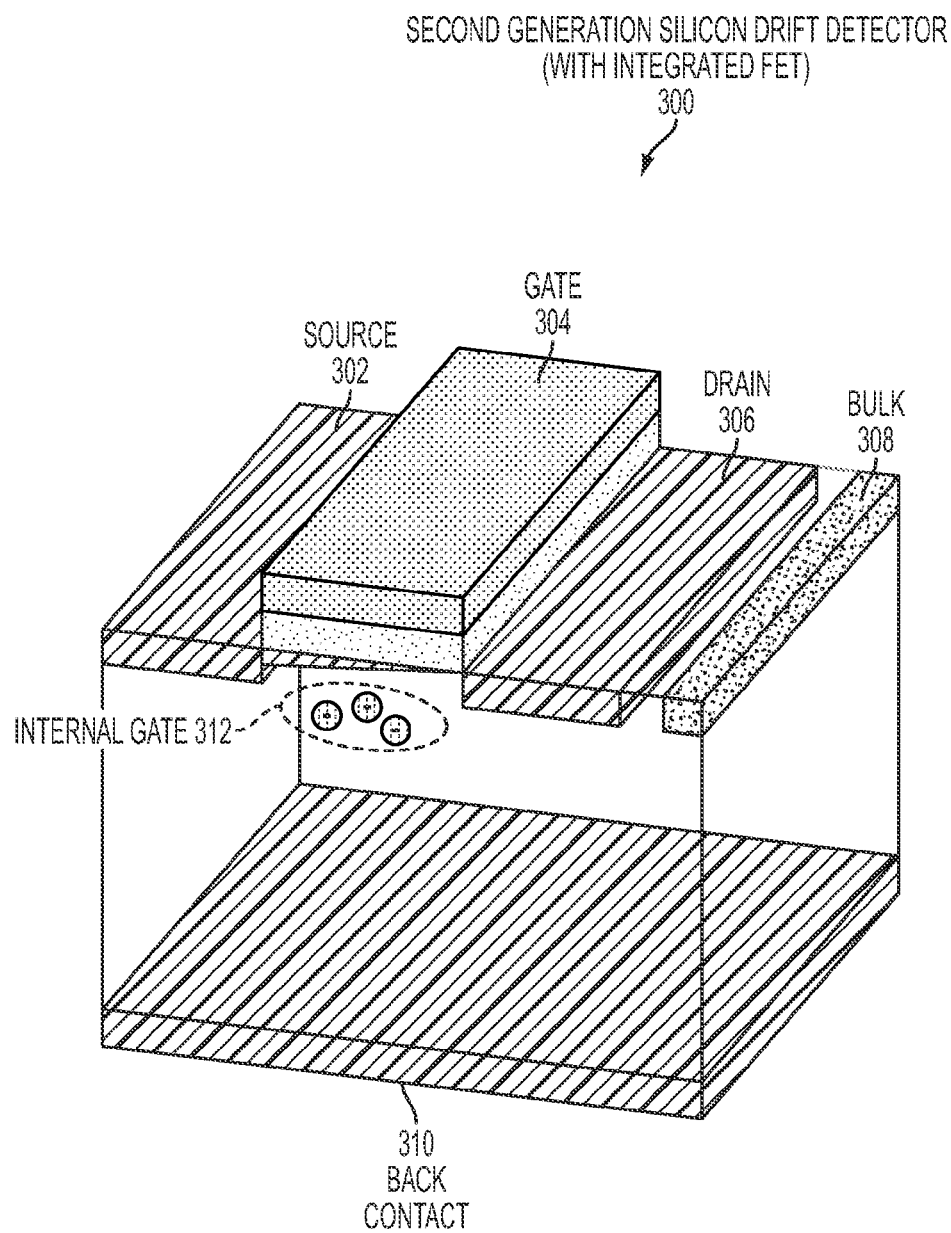
FIG. 3 illustrates a second generation SDD with an integrated Field Effect Transistor (FET).
Figure 8A:
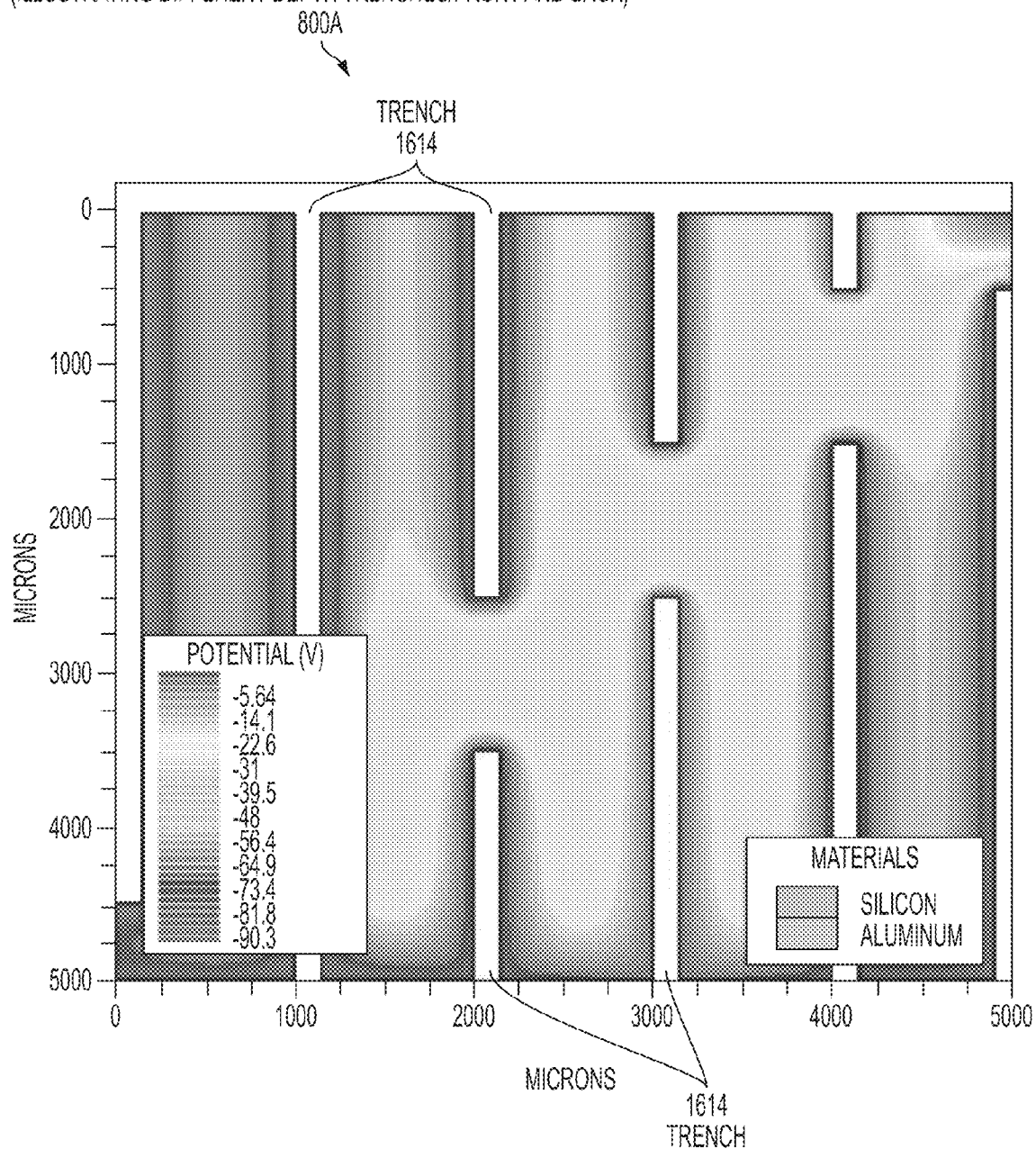
FIGS. 8A and 8B illustrate a schematic of a thick 3D SDD.
Figure 8B:
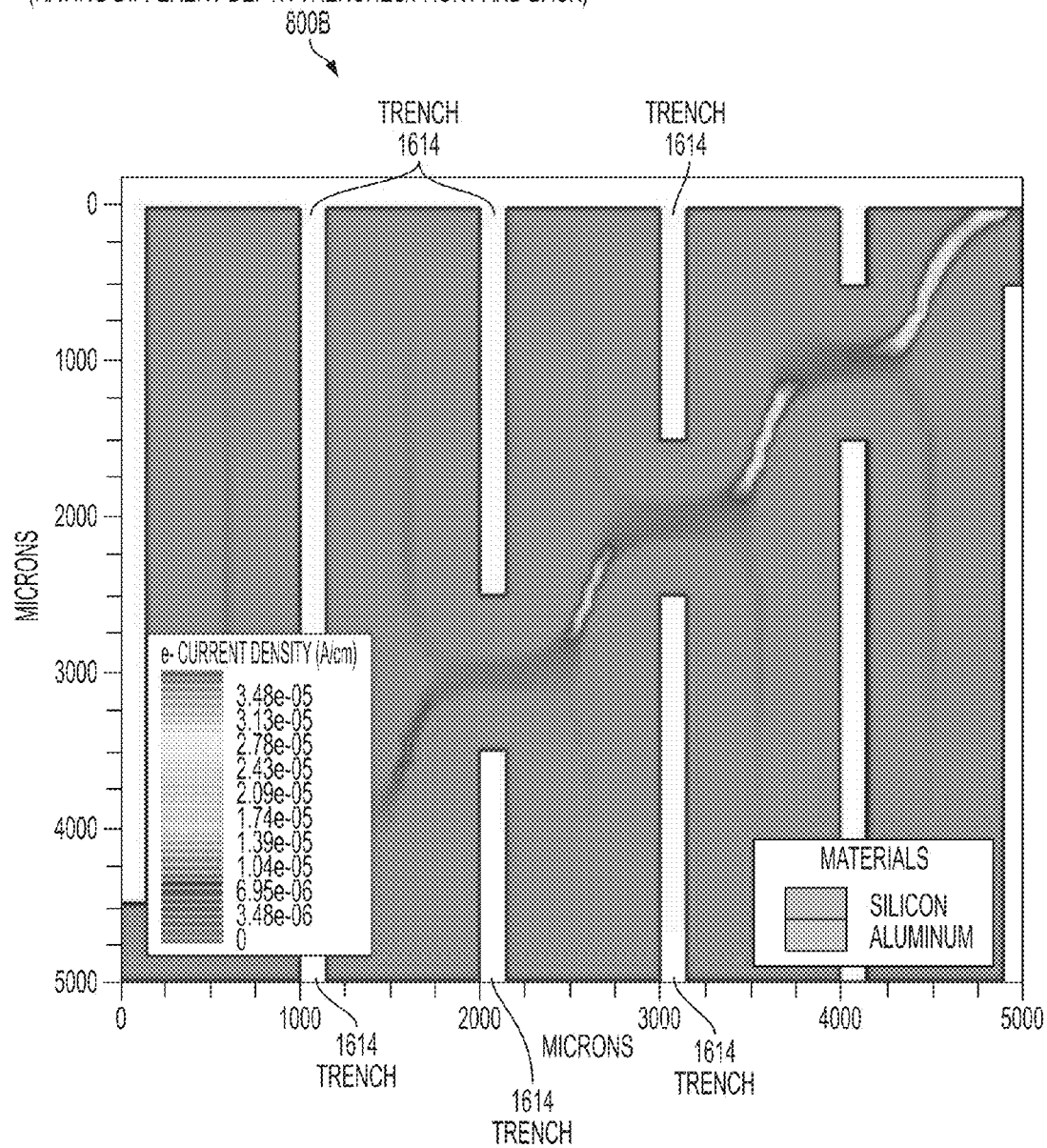

According to exemplary embodiments, FIG. 8A shows the potential distribution within a 3D SDD, where different depth trenches, such as trench 1614 are introduced on the front- and the backside of the device 800A. The bulk 308 (also, see FIG. 3) depletes laterally from the trenches, such as trench 1614. FIG. 8B shows the density distribution of the thermal electron component of the leakage current within a thick 3D SDD having different depth trenches/front and back 800B. The electron current is directed by the drift cathodes 1302 towards the collecting anode 206. The same "path" is used for the electron 108 collection. The deep penetrating trenches, such as each trench 1614 allow a lateral depletion.

Figure 9:
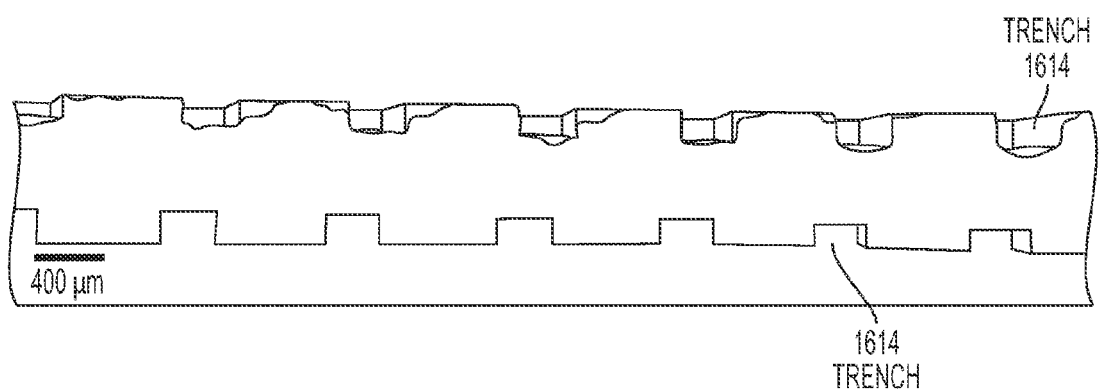
FIG. 9 illustrates a SEM micrograph, cross section of different depth trenches.
Figure 10:
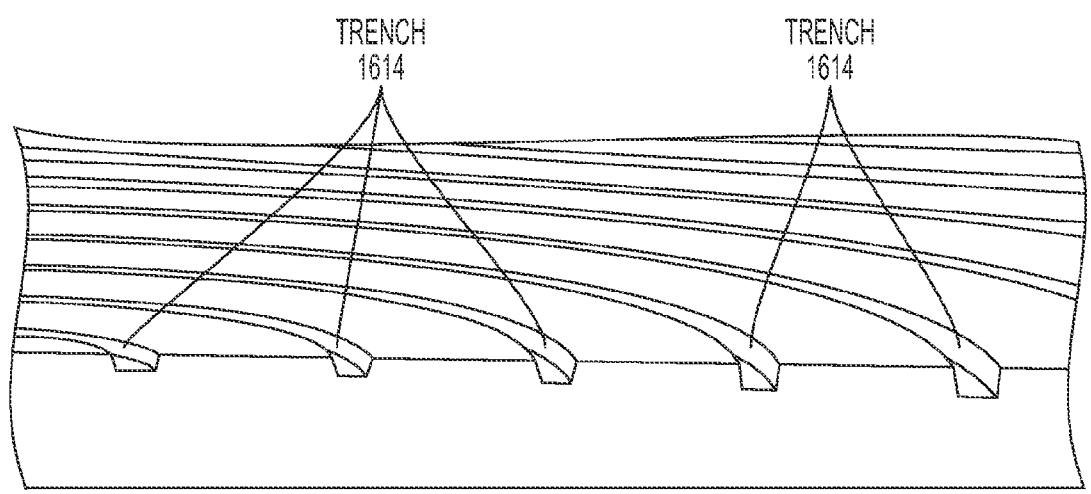
FIG. 10 illustrates a SEM micrograph, cross section of different depth trenches etched in a single process operation.
Figure 11:
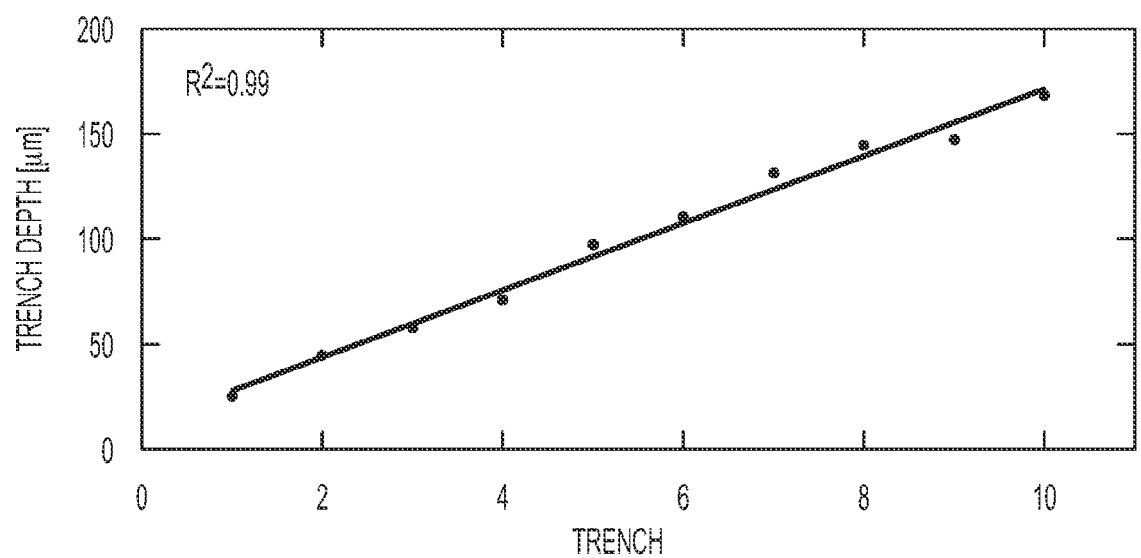
FIG. 11 illustrates trench depth after DRIE etching using gray tone lithography.
Figure 12:
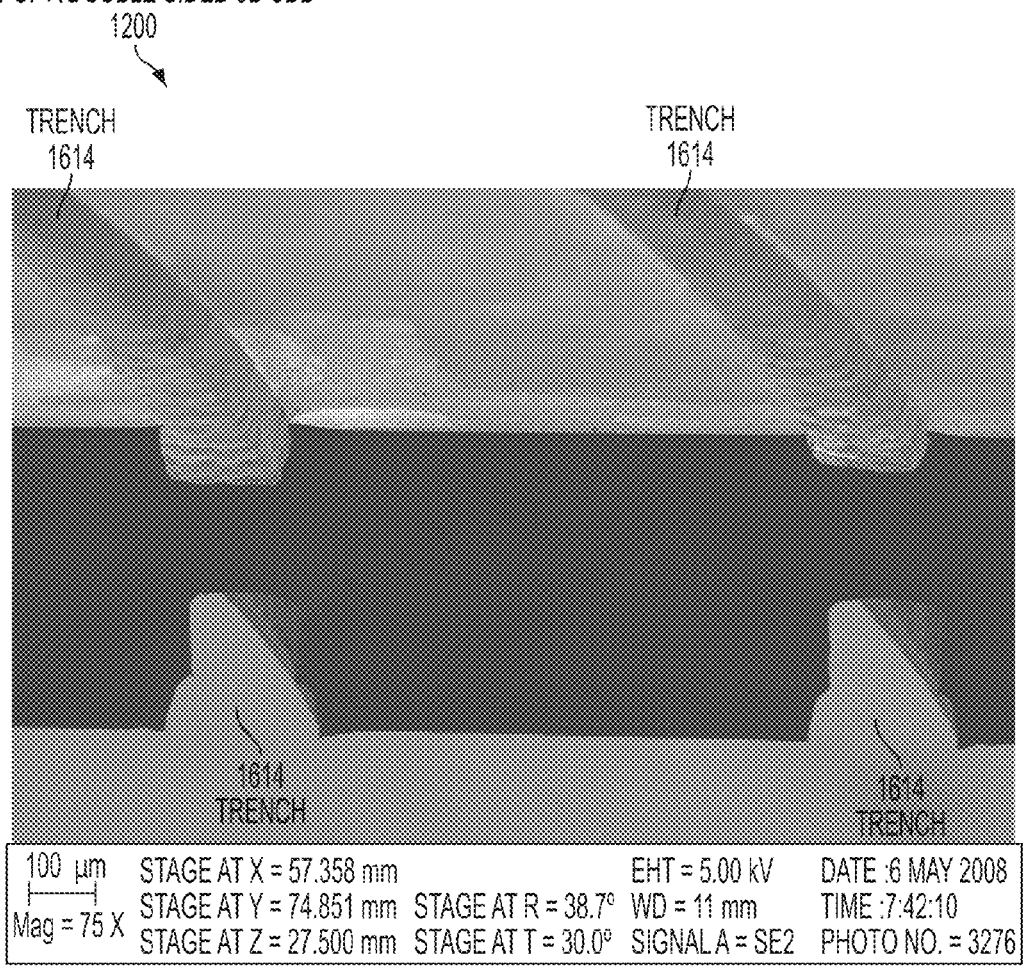
FIG. 12 illustrates a SEM micrograph, cross section of a double sided 3D SDD.

FIG. 9 and FIG. 10 show SEM (scanning electron micrograph) cross-section micrographs of different depth of each trench 1614 created in a silicon wafers 900 and 1000, respectively. Different depth trenches, such as depicted by each trench 1614 are introduced on the front- and the backside of a 1 mm thick silicon wafer. Each side of each trench 1614 is etched in a single DRIE etching step. These trenches (such as each trench 1614) were etched in a single DRIE process using a gray-tone photo-resist. FIG. 10 shows a SEM micrograph, cross-section, of different depth trenches (such as each trench 1614) etched in a single process step using gray-tone lithography, for a wafer thickness of 550 μm (see element 1000 in FIG. 10), where depth is a function of the trench 1614. The width of the trenches (as for each trench 1614) can be reduced for some devices. FIG. 12 shows a double-sided device, i.e. having trenches, such as trench 1614 of differing depths on each side of the device).

In general, processing of photo resist 1612 is accomplished by spin coating applications; however, with 3D topographies, the centrifugal force associated with spin coating causes the resist thickness to vary.

In exemplary embodiments, resist spray-coating is implemented, which circumvents the centrifugal force problem of the application of varying thickness of photo-resist on the silicon. Thus, resist spray-coating can reduce the fluid dynamic effect of photo-resist 1612 on the wafer as the resist droplets are supposed to stay where they are being deposited.

In planar devices, junctions are defined and/or formed by implanting ions into active regions. Ion implantation does not work for 3D detectors. Thus, the challenge is to be able to form a homogeneous junction inside the 3D topography. In exemplary embodiments, Boron is used on the front-side contact which homogeneously covers the trenches, such as each trench 1614. Simple ion-implantation will not lead to wall coverage inside the trenches. Exemplary embodiments use gaseous Boron tribromide (BBr3) and a Boron solid source diffusion process to form extremely homogeneous junctions inside the trenches, such as each trench 1614.

After the junction formation within the trenches (such as each trench 1614) regular micro-fabrication operations are performed to form metal-contacts and surface passivation layers.

Therefore, according to exemplary embodiments, the initial operations involving fabrication of SDDs can include fabricating a detector, using a gray tone lithography operation in combination with a plasma etching operation, in which these operations further comprise and/or include: forming a curved three dimensional (3D) resist profile in photo resist 1612 using a gray tone lithograph exposure.

Additionally, operations of transferring the 3D resist profile into a semiconducting substrate 1602 by a reactive ion etching operation and thus forming the curved detector to a specific topography, during the transferring of the 3D resist profile (which can be a curved profile) into the curved detector. Furthermore, the semiconducting substrate 1602 can be a silicon semiconductor device, which can be composed of low doped silicon devices having a plurality of electrical junctions (see FIG. 16, doping 1616 (of trench 1614)).

Additionally in exemplary embodiments, a plurality of 3D resist profiles can be formed and the gray tone lithography can include a plurality of gray tone lithography exposures.

Referring to FIG. 14A, FIG. 14B, FIG. 14C, FIG. 15 and FIG. 16, according to exemplary embodiments, fabricating a thick semiconductor drift detector method 1400 (hereafter "the method 1400") is initiated at an operation start 1402, where the thick semiconductor drift detector can be a detector such as radiation detector and pre-amp 1502. The method 1400 includes a thick semiconductor drift detector having a front side and a back side, including drift electrodes and a collecting electrode, using a gray tone lithography operation in combination with a plasma etching operation, and applying a plurality of voltages. Gray-tone lithography for photo-sculpting resist films includes resin solution liquid positive photo resist (i.e., AS 4330 photo resist from HEOCHST CELANESE) on the front side and the back side of the silicon substrate for guard ring and drift cathodes, and mask etch.

Further according to exemplary embodiments, plasma etching is used in combination with the gray-tone lithography. The plasma etching operation includes plasma etching for drift cathodes on the front side of the silicon substrate; and plasma etching to open anodes. A plurality of cleaning operations on the silicon substrate, wherein the plurality of cleaning operations include removal of organic contaminants, removal of a thin oxide layer, and removal of ionic contamination (i.e., RCA cleaning); and sulfuric acid hydrogen peroxide cleaning (Piranha cleaning).

Further, according to exemplary embodiments, deep reactive ion etching includes using resin solution liquid positive photo resist as masking material and removing resist operations with oxygen plasma and acetone.

According to exemplary embodiments, the method 1400 further includes washing the silicon substrate with wafer washer for water stain removal, spraying a resist coating on the silicon substrate, further includes spraying on resist to an open anode, spraying on resist on the front side and spraying on resist on the back side, evaporating A1 on the front side and the back side using e-beam evaporation operations, performing final testing of the detectors and dicing the silicon substrate.

Referring again to FIG. 14A, FIG. 14B, FIG. 14C, FIG. 15 and FIG. 16, and according to exemplary embodiments, at an operation forming the collecting electrode in a semiconducting substrate 1404 (hereafter "the operation 1404") (such as with the semiconducting substrate 1602), a collecting electrode 1608 is formed in the semiconducting substrate 1602 on the front side of the semiconducting substrate 1602, wherein the semiconducting substrate 1602 can be a silicon substrate.

Referring to FIG. 14A, FIG. 14B, FIG. 14C, FIG. 15 and FIG. 16, according to exemplary embodiments, at an operation forming a plurality of 3D profiles in photo-resist 1406 (hereafter "the operation 1406") (where the photo-resist is a photo-resist, such as the photo-resist 1612) gray-tone lithography by photo-sculpting resist films is used to create a plurality of 3D profiles in photo-resist 1612, where the photo-resist 1612 coating is sprayed onto semiconducting substrate 1602.

Again referring to FIG. 14A, FIG. 14B, FIG. 14C, FIG. 15 and FIG. 16, and according to exemplary embodiments, at an operation etching the semiconducting substrate conforming to a plurality of trenches 1408 (hereafter "the operation 1408"), where the trenches are trenches such as the trench 1614, and where the trenches (such as the trench 1614) have various depths created on the back side of the semiconductor substrate 1602. The etching operation 1408 includes reactive ion etching processes.

Referring to FIG. 14A, FIG. 14B, FIG. 14C, FIG. 15 and FIG. 16, according to exemplary embodiments, at an operation forming junctions inside the plurality of trenches 1410 (hereafter "the operation 1410"), junctions are formed inside of each trench 1614 of drifting electrodes formed on the back side of the semiconducting substrate 1602.

Referring again to FIG. 14A, FIG. 14B, FIG. 14C, FIG. 15 and FIG. 16, and according to exemplary embodiments, at an operation forming junctions on the front side 1412 (hereafter "the operation 1412") a plurality of junctions on the front side of the semiconducting substrate 1602 in the form of a plurality of drifting electrodes on the front side are formed having different depths, by using gaseous Boron tribromide (BBr3) and a Boron solid source diffusion process.

Again referring to FIG. 14A, FIG. 14B, FIG. 14C, FIG. 15 and FIG. 16, according to exemplary embodiments, at an operation forming electrical contacts 1414 (hereafter "the operation 1414") an electrical contact is formed on the collecting electrode 1608 and also a plurality of electrical contacts are formed on the plurality of drifting electrodes on the front and on the plurality of drifting electrodes on the back side of the semiconducting substrate 1602.

Referring to FIG. 14A, FIG. 14B, FIG. 14C, FIG. 15 and FIG. 16, according to exemplary embodiments, at an operation applying a plurality of voltages at the plurality of drifting electrodes 1416 (hereafter "the operation 1416") a plurality of voltages are applied to the plurality of drifting electrodes on the front side and at the plurality of drifting electrodes on the back side of the semiconducting substrate 1602, causing the semiconducting substrate 1602, i.e., the silicon substrate, to be fully depleted between neighboring trenches of the plurality of trenches and causing generated charge carriers to drift towards the collecting electrode 1608.

Figure 15:
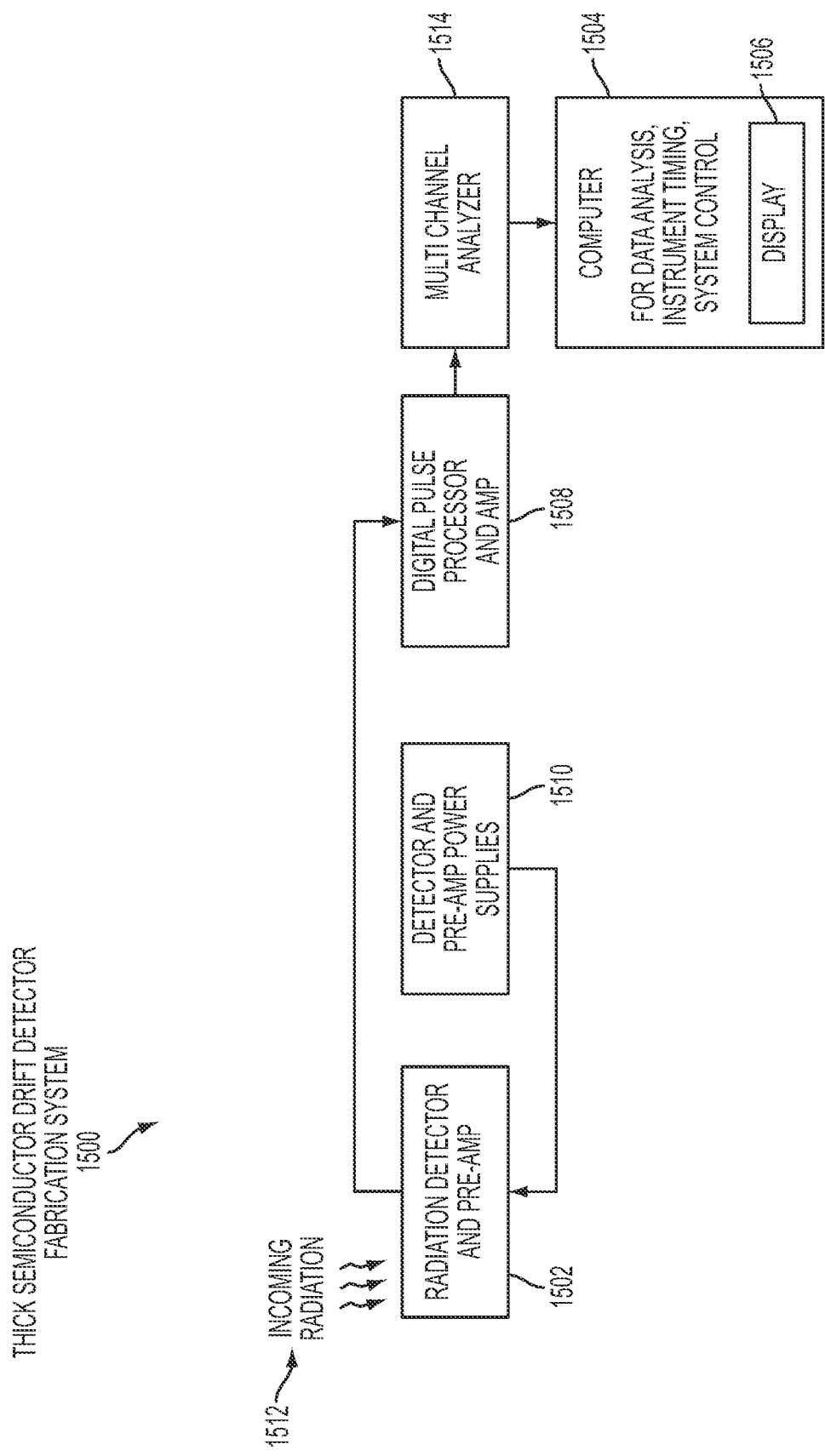
FIG. 15 illustrates a system used in the fabrication and testing of thick silicon drift detectors.

In addition to applying voltage potentials to the plurality of drifting electrodes, using detector and pre-amp power supplies 1510, depletion voltages and system descriptions of electrical quantities and instrument control and analysis can be effected and/or determined using computer controllers, processors, analyzers and automated measurement instrumentation, such as illustrated in FIG. 15. The instrumentation and automated computer processors and analyzers include the digital pulse processor and amp 1508, the multi channel analyzer 1514, the computer 1504 having a display 1506 and the detector and pre-amp power supplies 1510. In exemplary embodiments, determining depletion voltages between the plurality of trenches 1614 having different depths can be determined, by determining trench distance and substrate resistivity using the above mentioned instruments and processors in the thick semiconductor drift detector fabrication system 1500; furthermore, system descriptions of electrical quantities can be determined by performing finite element simulations.

According to exemplary embodiments, determining depletion voltage further includes: depositing 6,000 Angstrom thick thermal oxide; depositing open oxide for anodes on a front side of the silicon substrate with the plasma etching operation, depositing 300 Angstrom plasma-enhanced chemical vapor deposition (PECVD) oxide on the front side of the silicon substrate; implanting ions on a back side of the silicon substrate; and depositing 6,000 Angstrom PECVD oxide on the front side of the silicon substrate.

Additionally according to exemplary embodiments, of the method 1400, the plurality of trenches, such as the trench 1614, are etched into the semiconducting substrate 1602 from the front side and the back side of the semiconducting substrate 1602, using gray-tone lithography technology to photosculpt resist films to create a plurality of 3D profiles in photo-resists and etching the semiconducting substrate in conformity with the plurality of trenches having various depths, wherein etching includes reactive ion etching processing.

Referring to FIG. 16, the collecting electrode has a cylindrical symmetry and the plurality of drifting electrodes on the front side and the plurality of drifting electrodes on the back side of the semiconducting substrate 1602 are arranged in a circular symmetry around the collecting electrode 1608.

Further, according to exemplary embodiments, the plurality of drifting electrodes on the front side and the plurality of drifting electrodes on the back side are arranged in parallel to the collecting electrode 1608.

According to exemplary embodiments, the collecting electrode 1608 is rectangular-shaped; furthermore, the collecting electrode 1608 is placed between one of the plurality of drifting electrodes on the back side and the plurality of drifting electrodes on the front side.

Referring to FIG. 14A, FIG. 14B, FIG. 14C, FIG. 15 and FIG. 16, according to exemplary embodiments, a thick semiconductor drift detector (such as radiation detector and pre-amp 1502) having a front side and a back side, with a plurality of drifting electrodes and a collecting electrode 1608, formed from gray tone lithography operations combined with reactive ion etching on a curved surface, comprises a semiconducting substrate with the collecting electrode 1608 on the front side; a plurality of junctions formed on the front side, where the plurality of junctions are the plurality of drifting electrodes on the front side. The thick semiconductor drift detector, further comprises a plurality of trenches 1614 having different depths formed in the semiconductor substrate 1602 on the back side by gray tone lithography operations combined with reactive ion etching, causing the plurality of trenches 1614 to have different depths. A plurality of junctions formed inside the plurality of trenches having different depths forming the plurality of drifting electrodes on the back side; and have depletion voltages between the plurality of trenches 1614; and junctions formed inside the plurality of trenches 1614 having different depths, by using gaseous Boron tribromide (BBr3) and a Boron solid source diffusion process. A plurality of voltages can be applied at the plurality of drifting electrodes on the front side and the plurality of drifting electrodes on the back side, where the plurality of voltages fully deplete the semiconductor substrate between the plurality of trenches, such as the trench 1614, having different depths and provide a drifting electrical field causing generation of charge carriers towards the collecting electrode 1608.

According to exemplary embodiments, the thick semiconductor drift detector can have a semiconducting substrate 1602 made of silicon.

Further according to exemplary embodiments, the collecting electrode 1608 includes an integrated field effect transistor and the semiconducting substrate 1602 can be a compound semiconductor.

Further according to exemplary embodiments, the thick semiconductor drift detector includes the plurality trenches 1614 having various depths etched into the semiconducting substrate from the front side and the back side formed, from gray-tone lithography technology.

According to exemplary embodiments, the thick semiconductor drift detector further comprises a collecting electrode 1608 having either a cylindrical symmetry or is rectangular-shaped.

According to exemplary embodiments, the plurality of drifting electrodes are either arranged in a circular symmetry around the collecting electrode 1608 and/or arranged in parallel to the collecting electrode 1608.

Further, according to exemplary embodiments, the thick semiconductor drift detector further comprises guard ring and drift cathodes on the front side and the back side of the semiconducting substrate 1602 (and/or the silicon substrate) formed using gray-tone technology, including resin solution liquid positive photo resist 1612.

According to exemplary embodiments, the thick semiconductor drift detector further comprises open anodes.

Figure 4:
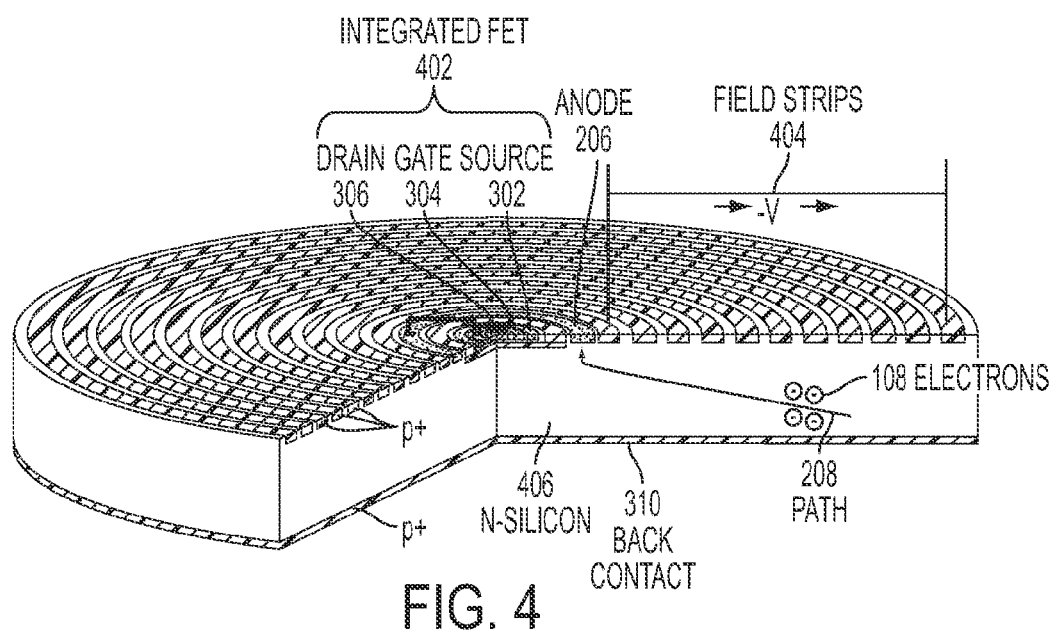
FIG. 4 illustrates a bulls eye shaped SDD with an integrated FET.
Figure 5:
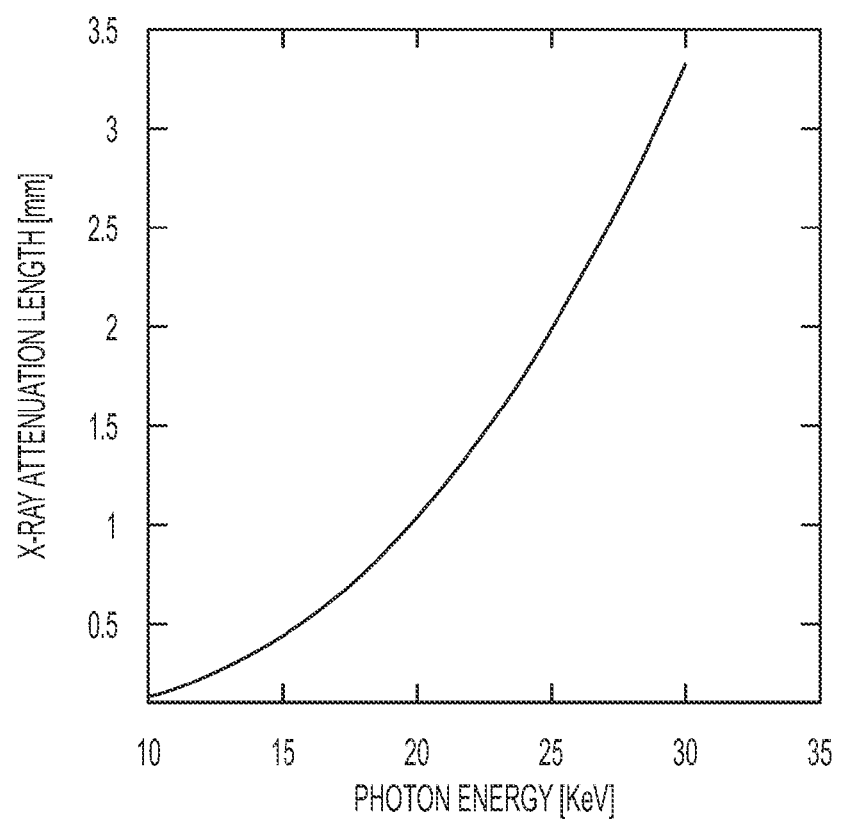
FIG. 5 illustrates X ray attenuation length of silicon.
Figure 6A:
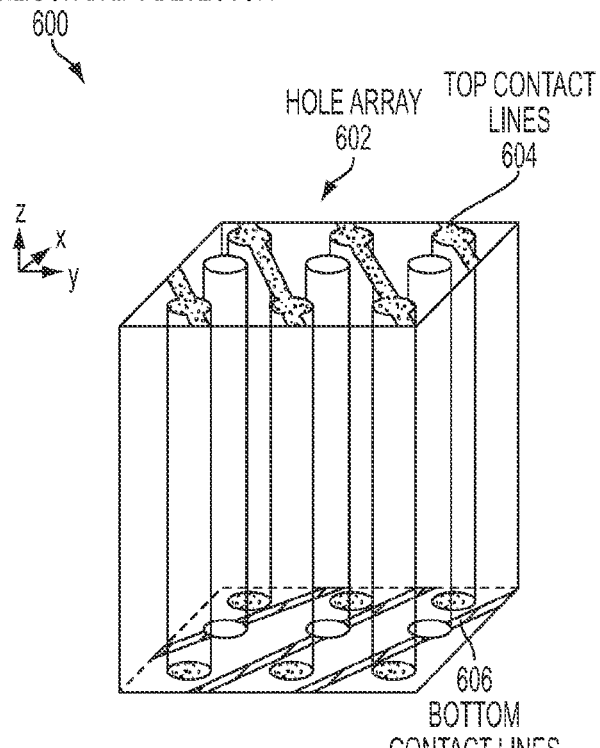
FIGS. 6A and 6B illustrate a classical 3D detector.
Figure 6B:
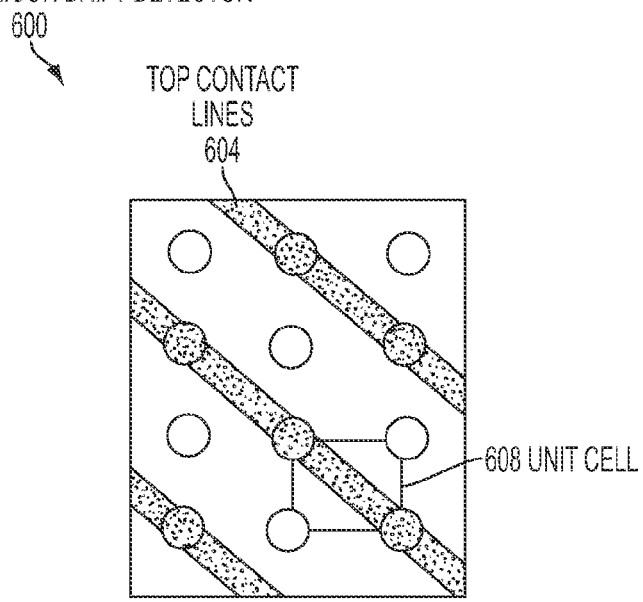
Figure 13A:
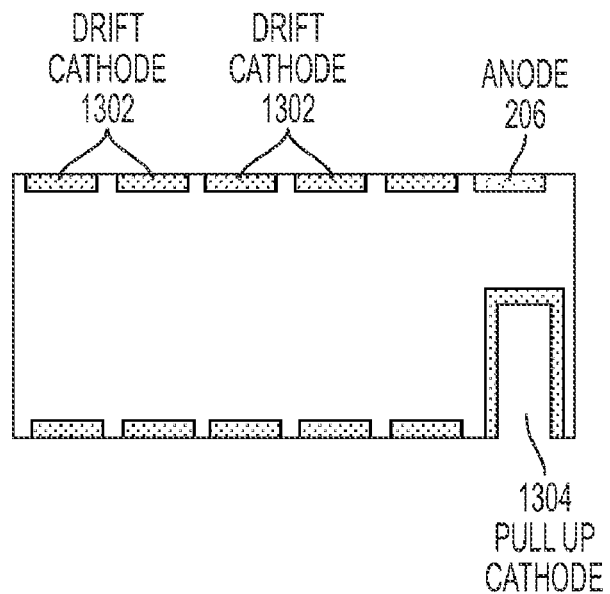
FIGS. 13A and 13B illustrate geometry variations.
Figure 13B:
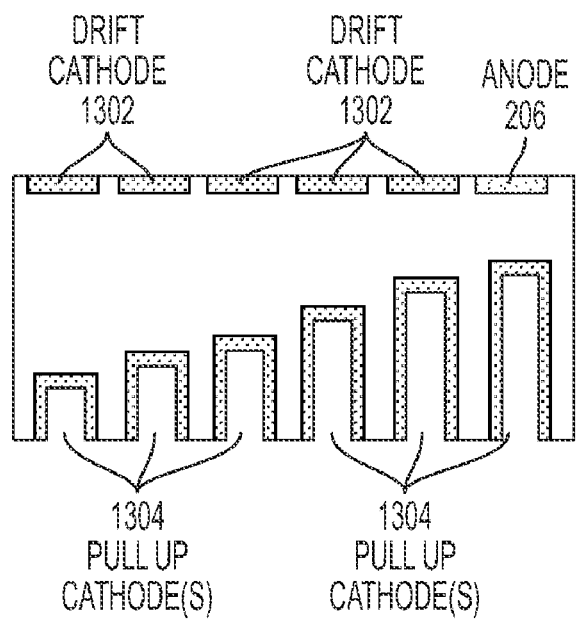
Figure 14A:
FIG. 14A illustrates a method of thick semiconductor drift detector fabrication 1400.
Figure 14B:
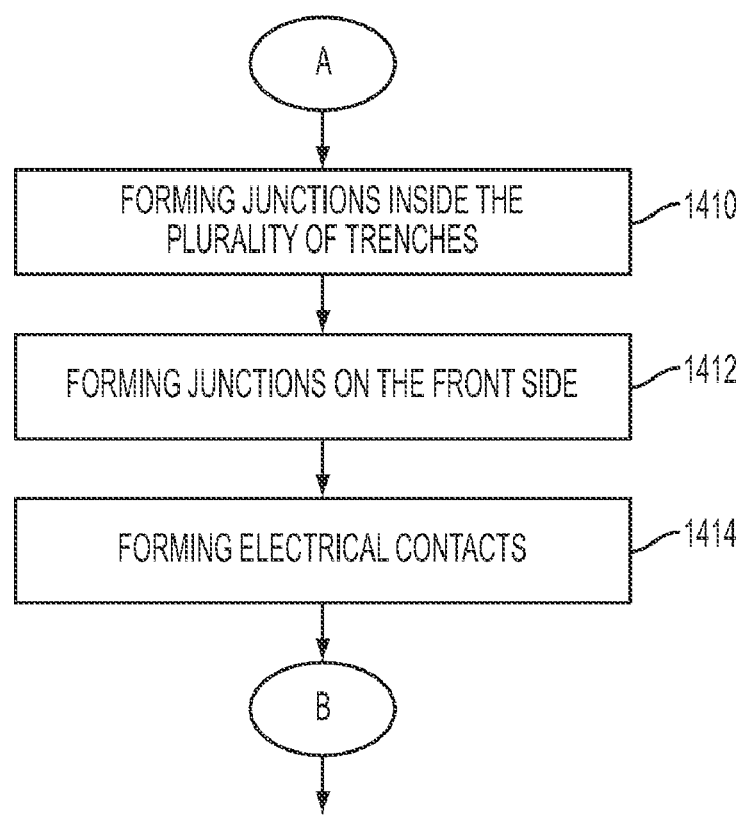
FIG. 14B illustrates a continuation of the method of thick semiconductor drift detector fabrication 1400.
Figure 14C:
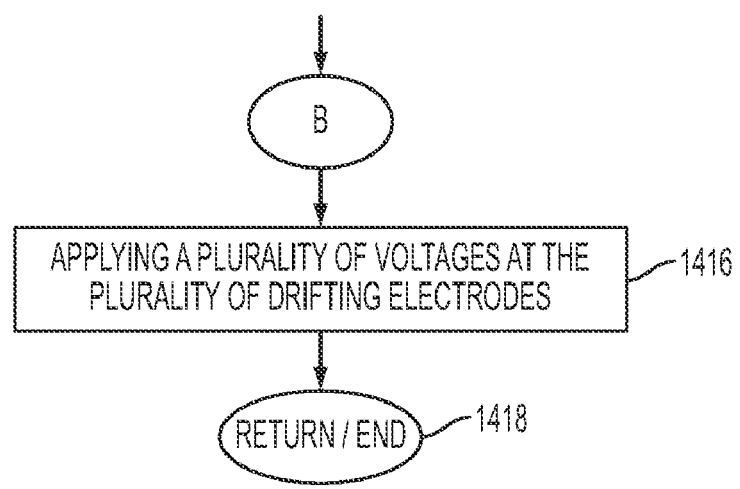
FIG. 14C illustrates a continuation of the method of thick semiconductor drift detector fabrication 1400.

While the exemplary embodiments have been particularly shown and described with reference to preferred embodiments thereof, it will be understood by those skilled in the art that the preferred embodiments including any first, second, third and/or fourth exemplary embodiments have been presented by way of example only, and not limitation; furthermore, various changes in form and details can be made therein without departing from the spirit and scope of the invention. For example, field effect transistors (FETs) can be integrated into the 3D SDDs, as illustrated in FIG. 4. Inclusion of FETs will allow for radiation measurements with very high energy resolution. In addition, the geometry of a 3D SDD can be simplified. FIG. 13A and FIG. 13B illustrate example geometries of simplified 3D SDDs. The first geometry, as illustrated in FIG. 13A, presents a single deep trench as a "pull-up" cathode 1304, which is placed "underneath" the collecting anode 206. The next geometry, as illustrated in FIG. 13B is a single-side trench array: The penetrating electrodes allow a more efficient depletion and help to reduce the needed voltages for the electrical drift fields.

Also, in exemplary embodiments, gray-tone technology will work, in principle, with any material that can be DRIE-etched. For example dry etch recipes for potentially novel detector materials like compound semiconductors, e.g. CdTe, GaN and SiC, have been published; and instead of spray-on resist, also e-beam lithography or direct laser-writing could be used to create the lithography on the curved topography. In both techniques the software utilized in the method operations can adjust for the focus point during resist exposure.

Thus, the breadth and scope of the present exemplary embodiments should not be limited by any of the above described preferred exemplary embodiments, but should be defined only in accordance with the following claims and their equivalents. All references cited herein, including issued U.S. patents, or any other references, are each entirely incorporated by reference herein, including all data, tables, figures, and text presented in the cited references. Also, it is to be understood that the phraseology or terminology herein is for the purpose of description and not of limitation, such that the terminology or phraseology of the present specification is to be interpreted by the skilled artisan in light of the teachings and guidance presented herein, in combination with the knowledge of one of ordinary skill in the art.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

What is claimed is:

1. A method of fabricating a thick semiconductor drift detector having a front side and a back side, including drift electrodes and a collecting electrode, using a gray tone lithography operation in combination with a plasma etching operation, and applying a plurality of voltages, the method comprising:

forming the collecting electrode in a semiconducting substrate on the front side;

forming, using gray-tone lithography by photo-sculpting resist films to create a plurality of 3D profiles in photo-resist;

etching the semiconducting substrate conforming to a plurality of trenches having various depths created on the back side, wherein etching includes reactive ion etching operations;

forming junctions inside the plurality of trenches in the form of a plurality of drifting electrodes on the back side;

forming a plurality of junctions on the front side in the form of a plurality of drifting electrodes on the front side;

forming electrical contacts on the plurality of drifting electrodes on the front and the plurality of drifting electrodes on the back side;

forming an electrical contact on the collecting electrode; and applying a plurality of voltages at the plurality of drifting electrodes on the front side and at the plurality of drifting electrodes on the back side, causing the semiconducting substrate to be fully depleted between neighboring trenches of the plurality of trenches and causing generated charge carriers to drift towards the collecting electrode.

2. The method according to claim 1, wherein the semiconducting substrate is silicon.

3. The method according to claim 1, wherein the collecting electrode includes an integrated field effect transistor.

4. The method according to claim 1, wherein the semiconducting substrate is a compound semiconductor.

5. The method according to claim 1, wherein the plurality of trenches are etched into the semiconducting substrate from the front side and the back side of the semiconducting substrate, using gray-tone lithography to photo-sculpt resist films to create a plurality of 3D profiles in photo-resists and etching the semiconducting substrate in conformity with the plurality of trenches having various depths, wherein etching includes reactive ion etching processing.

6. The method according to claim 1, wherein the collecting electrode has a cylindrical symmetry.

7. The method according to claim 1, wherein the plurality of drifting electrodes on the front side and the plurality of drifting electrodes on the back side are arranged in a circular symmetry around the collecting electrode.

8. The method according to claim 7, wherein the plurality of drifting electrodes on the front side and the plurality of drifting electrodes on the back side are arranged in parallel to the collecting electrode.

9. The method according to claim 8, wherein the collecting electrode is rectangular-shaped.

10. The method according to claim 9, wherein the collecting electrode is placed between one of the plurality of drifting electrodes on the back side and the plurality of drifting electrodes on the front side.

11. The method according to claim 9, wherein the collecting electrode is segmented.

12. A thick semiconductor drift detector having a front side and a back side, with a plurality of drifting electrodes and a collecting electrode, formed from gray tone lithography operations combined with reactive ion etching on a curved surface, the thick semiconductor drift detector comprising:
    a semiconducting substrate with the collecting electrode on the front side;
    a plurality of junctions formed on the front side, wherein the plurality of junctions are the plurality of drifting electrodes on the front side;
    a plurality of trenches having different depths formed in the semiconductor substrate on the back side by gray tone lithography operations combined with reactive ion etching, causing the plurality of trenches to have different depths;
    a plurality of junctions formed inside the plurality of trenches having different depths forming the plurality of drifting electrodes on the back side; and
    a plurality of voltages applied at the plurality of drifting electrodes on front side and the plurality of drifting electrodes on the back side, wherein the plurality of voltages fully deplete the semiconductor substrate between the plurality of trenches having different depths and provide a drifting electrical field causing generation of charge carriers towards the collecting electrode.

13. The thick semiconductor drift detector according to claim 12, wherein the semiconducting substrate is silicon.

14. The thick semiconductor drift detector according to claim 12, wherein the collecting electrode includes an integrated field effect transistor.

15. The thick semiconductor drift detector according to claim 12, wherein the semiconducting substrate is a compound semiconductor.

16. The thick semiconductor drift detector according to claim 12, wherein the plurality trenches having various depths are etched into the semiconducting substrate from the front side and the back side forming, using gray-tone lithography to photo-sculpt resist films, to create a plurality of 3D profiles in photo-resists and etching the semiconducting substrate in conformity with the plurality of trenches having various depths, wherein etching includes reactive ion etching processes.

17. The thick semiconductor drift detector according to claim 12, wherein the collecting electrode has a cylindrical symmetry.

18. The thick semiconductor drift detector according to claim 12, wherein the plurality of drifting electrodes are arranged in a circular symmetry around the collecting electrode.

19. The thick semiconductor drift detector according to claim 12, wherein the collecting electrode is rectangular-shaped.

20. The thick semiconductor drift detector according to claim 12, wherein the plurality of drifting electrodes are arranged in parallel to the collecting electrode.

* * * * *